(12) United States Patent
Vampa et al.

(10) Patent No.: US 10,107,846 B2
(45) Date of Patent: Oct. 23, 2018

(54) APPARATUS AND METHOD FOR STRONG-FIELD PROBING OF ELECTRIC FIELDS IN SOLID-STATE ELECTRONIC CIRCUITS

(71) Applicant: University of Ottawa, Ottawa, Ontario (CA)

(72) Inventors: Giulio Vampa, Ottawa (CA); Paul B. Corkum, Ottawa (CA)

(73) Assignee: University of Ottawa, Ottawa, Ontario (CA)

( * ) Notice: Subject to any disclaimer, the term of this patent is extended or adjusted under 35 U.S.C. 154(b) by 0 days.

(21) Appl. No.: 15/664,116

(22) Filed: Jul. 31, 2017

(65) Prior Publication Data

US 2017/0350929 A1    Dec. 7, 2017

Related U.S. Application Data

(63) Continuation-in-part of application No. 15/337,331, filed on Oct. 28, 2016, now Pat. No. 9,746,748.

(60) Provisional application No. 62/248,372, filed on Oct. 30, 2015.

(51) Int. Cl.
*G02F 1/37* (2006.01)
*G02F 1/355* (2006.01)
*G02F 1/35* (2006.01)
*G01R 29/12* (2006.01)

(52) U.S. Cl.
CPC ............ *G01R 29/12* (2013.01); *G02F 1/353* (2013.01); *G02F 1/3556* (2013.01); *G02F 1/37* (2013.01); *G02F 2001/354* (2013.01); *G02F 2202/104* (2013.01); *G02F 2203/10* (2013.01)

(58) Field of Classification Search
CPC ....... G01R 29/12; G02F 1/353; G02F 1/3556; G02F 1/37; G02F 2001/354; G02F 2202/104; G02F 2203/10
See application file for complete search history.

(56) References Cited

U.S. PATENT DOCUMENTS

| | | | |
|---|---|---|---|
| 6,456,423 B1 * | 9/2002 | Nayfeh | B82Y 20/00 324/97 |
| 6,587,258 B1 * | 7/2003 | Kane | G01R 31/311 324/754.06 |
| 9,496,681 B2 * | 11/2016 | Vampa | H01S 5/042 |

(Continued)

OTHER PUBLICATIONS

Keldysh et al., "Ionization in the Field of a Strong Electromagnetic Wave", Soviet Physics JETP, vol. 20, No. 5, pp. 1307-1315, (1965).

(Continued)

*Primary Examiner* — Rhonda S Peace
(74) *Attorney, Agent, or Firm* — MILES & STOCKBRIDGE P.C.; Ajay A. Jagtiani (57) ABSTRACT

A method and apparatus for generating high-order harmonics in a solid-state medium comprising integrated semiconductor devices and electronics. The high-order harmonics interact with and are modified by the internal electric field associated with the operation of the integrated semiconductor devices and electronics. Measurement of the high-order harmonics after modification by the internal electric fields amounts to high resolution (temporal and spatial) dynamic imaging of the internal electric fields associated with the integrated semiconductor devices and electronics.

19 Claims, 6 Drawing Sheets

(56) References Cited

U.S. PATENT DOCUMENTS

| | | | |
|---|---|---|---|
| 9,746,748 B2* | 8/2017 | Vampa | G02F 1/353 |
| 9,921,248 B2* | 3/2018 | Brodzeli | G01R 15/24 |
| 2014/0354263 A1* | 12/2014 | Brodzeli | G01R 29/12 |
| | | | 324/96 |
| 2017/0123291 A1* | 5/2017 | Vampa | G02F 1/353 |
| 2017/0205377 A1* | 7/2017 | Garnett | G01N 29/2418 |
| 2017/0350929 A1* | 12/2017 | Vampa | G01R 29/12 |

OTHER PUBLICATIONS

Corkum et al., "Attosecond science", Nature Physics vol. 3, pp. 381-387 (2007).
Ghimire et al., "Observation of high-order harmonic generation in a bulk crystal", Nature Physics, vol. 7, pp. 138-141 (2011).
Vampa et al, "Linking high harmonics from gases and solids", Nature, vol. 522, pp. 462-472 (2015).
Schultze, et al., "Attosecond band-gap dynamics in silicon", vol. Science 346, Issue 6215, pp. 1348-1352 (2014).
Pronin et al., "Harmonic generation by a one-dimensional conductor: Exact results" Physical Review B, 50, pp. 3473-3476 (1994).
Vampa et al., "Theoretical Analysis of High-Harmonic Generation in Solids", Physical Review Letters, PRL 113, pp. 073901-1 to 073091-5 (2014).
Wu et al., "High-harmonic generation from Bloch electrons in solids", Physical Review A 91, pp. 043839-1 to 043839-11(2015).
Hohenleutner et al., "Real-time observation of interfering crystal electrons in high-harmonic generation", Nature, vol. 523, pp. 572-589 (2015).
Hawkins et al., "Effect of multiple conduction bands on high-harmonic emission from dielectrics", Physcial Review A 91, pp. 013405-1 to 013405-5 (2015).
Semiconductors on NSM website—http://www.ioffe.ru/SVA/NSM/Semicond/.
Dudovich et al., "Measuring and controlling the birth of attosecond XUV pulses", Nature Physics, vol. 2, pp. 781-786 (2006).
He et al., "Inteference effects in two-color high-order harmonic generation", Physical Review A82, pp. 033410-1 to 033410-4 (2010).
Jellison, "Optical functions of GaAs, GaP, and Ge determined by two-channel polarization modulation ellipsometry", Optical Materials, vol. 1, pp. 151-160 (1992).
Dahlstrom et al., "Quantum mechanical approach to probing the birth of attosecod pulses using a two-colour field", Journal of Physics B: Atomic, Molecular and Optical Physics, vol. 44, pp. 095602-095608 (2011).
Ruzicka et al., "Second-Harmonic Generation Induced by Electric Currents in GaAs", Physical Review Letters, PRL 108, pp. 077403-1 to 077403-5 (2012).
Smirnova et al., "High harmonic interferometry of multi-electron dynamics in molecules", Nature, vol. 460, pp. 972-977 (2009).
Rickman, "The commericialization of silicon photonics" Nature Photonics, vol. 8, pp. 579-582 (2014).
Stockman, "Nanoplasmonics: The physics behind the applications" Physics Today, pp. 39-44 (2011).
Kim et al., "High-harmonic generation by resonant plasmon field enhancement", Nature, vol. 453, pp. 757-760 (2008).
Park et al.,"Plasmonic generation of ultrashort extreme-ultraviolet light pulses", Nature Photonics, vol. 5, pp. 677-681 (2011).
Park et al., "Generation of EUV radiation by plasmonic field enhancement using nano-structured bowties and funnel-waveguides", Ann. Phys., vol. 525, No. 1-2, pp. 87-96 (2013).
Kim et al., "Nanostructure-enhanced atomic line emission", Nature, vol. 485, pp. E1-E3 (2012).
Sivis et al., "Extreme-ultraviolet light generation in plasmonic nanostructures", Nature Physics, vol. 9, pp. 304-309 (2013).
Raschke, "High-harmonic generation with plasmonics: feasible or unphysical?" Ann. Phys., vol. 525, No. 3, pp. A40-A42 (2013).
Feist et al., "Nanoplasmonic near-field synthesis", Physical Review A 87, pp. 033816-1 to 033816-6 (2013).
Ashcroft, Neil W., and N. David Mermin. "Solid state physics." (1976), ch. 29.
Raja, Archana, et al. "Coulomb engineering of the bandgap in 2D semiconductors." arXiv preprint arXiv:1702.01204 (2017).
Holler, Mirko, et al. "High-resolution non-destructive three-dimensional imaging of integrated circuits." Nature 543.7645 (2017): 402-406.
Dierolf, M. et al. Ptychographic X-ray computed tomography at the nanoscale. Nature 467, 436-439 (2010).
Gignac, L. M., Beslin, C., Gonsalves, J., Stellari, F. & Lin, C. C. High energy BSE/SE/STEM imaging of 8 um thick semiconductor interconnects. Microsc. Microanal. 20, 8-9 (2014).
Tetienne, Jean-Philippe, et al. "Quantum imaging of current flow in graphene." Science Advances 3.4 (2017): e1602429.
Timurdogan, E., et al. "Electric field-induced second-order nonlinear optical effects in silicon waveguides." Nature Photonics 11.3 (2017): 200-206.
Sun, Chi-Kuang, et al. "Scanning second-harmonic/third-harmonic generation microscopy of gallium nitride." Applied Physics Letters 77.15 (2000): 2331-2333.
Terhune, R. W., P. D. Maker, and C. M. Savage. "Optical harmonic generation in calcite." Physical Review Letters 8.10 (1962): 404.
Piggott, Alexander Y., et al. "Inverse design and demonstration of a compact and broadband on-chip wavelength demultiplexer." Nature Photonics 9.6 (2015): 374-377.
Englund, Dirk, et al. "Controlling cavity reflectivity with a single quantum dot." Nature 450.7171 (2007): 857-861.
Dexheimer, Susan L, ed. Terahertz spectroscopy: principles and applications. CRC press, 2007, chapter 2, pp. 48-49.
Boyd, Robert W. "Nonlinear optics." Handbook of Laser Technology and Applications (Three-Volume Set). Taylor & Francis, 2003. 161-183.
Bloembergen, Nicolaas, and P. S. Pershan. "Light waves at the boundary of nonlinear media." Physical Review 128.2 (1962): 606.
Corkum, Paul B. "Plasma perspective on strong field multiphoton ionization." Physical Review Letters 71.13 (1993): 1994.
Ferray, M., et al. "Multiple-harmonic conversion of 1064 nm radiation in rare gases." Journal of Physics B: Atomic, Molecular and Optical Physics 21.3 (1988): L31.
Lopez-Martens, Rodrigo, et al. "Amplitude and phase control of attosecond light pulses." Physical Review Letters 94.3 (2005): 033001.
Chiorescu, I., et al. "Coherent quantum dynamics of a superconducting flux qubit." Science 299.5614 (2003): 1869-1871.
McNeil, R. P. G., et al. "On-demand single-electron transfer between distant quantum dots." Nature 477.7365 (2011): 439-442.
Chang, Chuan C. "Silicon-on-sapphire epitaxy by vacuum sublimation: Leed-auger studies and electronic properties of the films." Journal of Vacuum Science and Technology 8.3 (1971): 500-511.3).
Stewart et al., "Nanostructured plasmonic sensors", Chemical Reviews, vol. 108, pp. 494-521 (2008).
Cingöz et al., "Direct frequency comb spectroscopy in the extreme ultraviolet", Nature, vol. 482, pp. 68-71 (2012).
Pfeifer et al., "Femtosecond x-ray science", Reports on Progress in Physics, vol. 69, pp. 443-505 (2006).
Luu et al., "Extreme ultraviolet high-harmonic spectroscopy of solids", Nature, vol. 521, pp. 498-502 (2015).
Schubert et al., "Sub-cycle control of terahertz high-harmonic generation by dynamical Bloch oscillations", Nature Photonics, vol. 8, pp. 119-123 (2014).
Vampa et al., "Generation of high harmonics from silicon", arXiv preprint arXiv:1605.06345 (2016).
Boyd, R. W., Nonlinear Optics, 2nd Edition, Academic press, 2003.
Pfullmann et al., "Bow-tie nano-antenna assisted generation of extreme ultraviolet radiation", New Journal of Physics, vol. 15, pp. 093027 (2013).
Pfullmann et al., "Nano-antenna-assisted harmonic generation", Applied Physics B, vol. 113, pp. 75-79 (2013).
Guler et al, "Nanoparticle plasmonics: going practical with transition metal nitrides", Materials Today, vol. 18, No. 4, pp. 227-237 (2015).
Barwick et al., "Photon-induced near-field electron microscopy", Nature, vol. 462, pp. 902-906 (2009).

(56) References Cited

OTHER PUBLICATIONS

Kawata et al., "Plasmonics for near-field nano-imaging and superlensing", Nature Photonics, vol. 3, pp. 388-394 (2009).

Zhang et al., "High contrast 3D imaging of surfaces near the wavelength limit using tabletop EUV ptychography", Ultramicroscopy, vol.158, pp. 98-104 (2015).

Chapman et al., "Femtosecond Diffractive Imaging with a Soft-X-ray Free-Electron Laser", Nature Physics, vol. 2, pp. 839-843 (2006).

Förg et al., "Attosecond nanoscale near-field sampling", Nature Communications 7, (2016).

Kim et al., "Petahertz optical oscilloscope", Nature Photonics, vol. 7, pp. 958-962 (2013).

Vampa et al., "Linking high harmonics from gases and solids", Nature, vol. 522, pp. 462-464 (2015).

Ciappina et al., "High-order-harmonic generation from inhomogeneous fields, "Physical Review A 85, pp. 033828-1 to 033828-11 (2012).

Yu et al., "Flat optics with designer metasurfaces", Nature Materials, vol. 13, pp. 139-150 (2014).

Barbry. et al., "Atomistic Near-Field Nanoplasmonics: Reaching Atomic-Scale Resolution in Nanooptics", Nano Letters vol. 15, pp. 3410-3419 (2015).

http://www.mtixtl.com/sossilicononsapphire-2.aspx.

Ghamsari et al., "Enhanced Raman scattering in graphene by plasmonic resonant Stokes emission", Nanophotonics, vol. 3, No. 6, pp. 363-371, Dec. 2014.

Mousavi et al., "Periodic plasmonic nanoantennas in a piecewise homogeneous background", Optics Express; vol. 20, No. 16; pp. 18044-10865 (2012).

Vampa et al. "Theoretical Analysis of High-Harmonic Generation in Solids", Physical Review Letters PRL 113; pp. 073901-1 to 073901-5 (2014).

Vampa et al., "Semiclassical analysis of high harmonic generation in bulk crystals", Physical Review B 91; pp. 064302-1 to 064302-11 (2015).

Piller, "Silicon (Amorphous) (a-Si)", E. D. Palik, Handbook of Optical Constants of Solids, Academic Press, San Diego, vol. 1, pp. 571-586 (1998).

* cited by examiner

APPARATUS AND METHOD FOR STRONG-FIELD PROBING OF ELECTRIC FIELDS IN SOLID-STATE ELECTRONIC CIRCUITS

CROSS-REFERENCE TO RELATED APPLICATIONS

This application claims benefit of priority of U.S. patent application Ser. No. 15/337,331 entitled, "APPARATUS AND METHOD FOR GENERATION OF HIGH HARMONICS FROM SILICON" filed Oct. 28, 2016, which claims benefit of priority of U.S. Provisional Patent Application No. 62/248,372, entitled "GENERATION OF HIGH HARMONICS FROM SILICON," filed Oct. 30, 2015. The entire contents and disclosures of which are incorporated herein by reference in their entirety.

FIELD OF THE INVENTION

The disclosed invention relates to dynamic and high resolution probing of internal electric fields in solid-state based systems. More specifically, the disclosed invention is directed to generation, processing and measurement of high-order harmonics in semiconductor or dielectric material/medium for dynamic and high resolution probing of the internal electric field associated with semiconductor devices and systems.

BACKGROUND OF THE INVENTION

Extracting information from fast-evolving phenomena requires probe signals that are shorter in duration than the time scale of the physical phenomena under study. Tunable generation of such ultra-short signals in ultraviolet regime, particularly in technically relevant material such as silicon, despite their broad implications, have remained largely unexplored.

Accordingly, it is desirable to provide novel methods and systems for generation, processing and measurement of ultra-short probe signals as high-order harmonics in semiconductor material.

SUMMARY

The foregoing needs are met, to a great extent, wherein according to first broad aspect, the disclosed invention provides a method comprising: generating one or more high-order harmonics in a semiconductor or dielectric medium, directing the one or more high-order harmonics towards one or more semiconductor devices on or within the semiconductor or dielectric medium, to thereby facilitate an interaction of one or more high-order harmonics with one or more internal electric fields of the one or more semiconductor devices, and measuring one or more high-order harmonics to to construct a high resolution dynamic profile of the one or more internal electric fields.

According to a second broad aspect, the disclosed invention provides an apparatus comprising: a semiconductor substrate further comprising: a semiconductor-laser interaction region; a first input configured to focus a driving laser field onto the semiconductor-laser interaction region to thereby generate one or more high-order harmonics in the semiconductor-laser interaction region, a second input configured to direct a propagation of the one or more high-order harmonics in the semiconductor substrate, and an output for outputting the one or more high-order harmonics.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the instant invention.

DETAILED DESCRIPTION OF THE PREFERRED EMBODIMENTS

Definitions

Where the definition of terms departs from the commonly used meaning of the term, applicant intends to utilize the definitions provided below, unless specifically indicated.

For purposes of the disclosed invention, it should be noted that the singular forms, "a," "an" and "the," include reference to the plural unless the context as herein presented clearly indicates otherwise.

For purposes of the disclosed invention, directional terms such as "top," "bottom," "upper," "lower," "above," "below," "left," "right," "horizontal," "vertical," "up," "down," etc., are used merely for convenience in describing the various embodiments of the disclosed invention. The embodiments of the disclosed invention may be oriented in various ways. For example, the diagrams, apparatuses, etc., shown in the drawing figures may be flipped over, rotated by 90° in any direction, reversed, etc.

For purposes of the disclosed invention, a value or property is "based" on a particular value, property, the satisfaction of a condition or other factor if that value is derived by performing a mathematical calculation or logical operation using that value, property or other factor.

For purposes of the disclosed invention, the term "AC field" refers to a periodically or non-periodically varying electric field.

For purposes of the disclosed invention, the term "characteristic atomic binding field strength" refers to the atomic field strength keeping outer most electrons bound to the parent atom. In order for an impinging electromagnetic field to ionize the atom it must have a field strength equal to or in excess of the characteristic atomic binding field strength.

For purposes of the disclosed invention, the term "DC field" refers to a constant electric field.

For purposes of the disclosed invention, the term "drive laser" or "driver laser" may be used interchangeably with the term "driving laser".

For purposes of the disclosed invention, the term "driving field" or "drive field" or "driver field" refers to the electric field associated with a driving laser and may be used interchangeably with the terms "driving laser field" or "drive laser field" or "driver laser field".

For purposes of the disclosed invention, the term "driving laser" or "driver laser" refers to the fundamental signal, if the fundamental signal is a laser pulse.

For purposes of the disclosed invention, the term "fundamental field" refers to the electric field associated with a fundamental signal.

For purposes of the disclosed invention, the term "fundamental frequency" refers to the frequency of the fundamental signal.

For purposes of the disclosed invention, the term "fundamental signal" refers to a signal that non-linearly interacts with a medium in order to produce high-order harmonics of the fundamental signal frequency from the medium.

For purposes of the disclosed invention, the term "high-order harmonic" refers to the high integer multiples of the fundamental signal.

For purposes of the disclosed invention, the term "interaction region" refers to the region where a fundamental signal interacts with a medium in order to generate high-order harmonics of the fundamental signal from the medium.

For purposes of the disclosed invention, the term "laser-driven electron-ion re-collision process" refers to the electron re-collision process underlying the high harmonic generation process when such a process is driven by a laser signal.

For purposes of the disclosed invention, the term "modulated" refers to the act, effect, outcome or condition of modulation upon a signal.

For purposes of the disclosed invention, the term "modulation" refers to any type of modification or alteration brought upon or imposed onto the spatial, temporal or spectral properties of a signal.

For purposes of the disclosed invention, the term "nanoplasmonic features" refers to any feature that produces/controls/modifies or is subjected to one or more plasmonic events at the nano scale.

For purposes of the disclosed invention, the term "nanoplasmonic" refers to the plasmonic effect that occurs at the nano scale.

For purposes of the disclosed invention, the term "optical signal" refers to an electromagnetic signal with a wavelength range extending from Infra-red to X-ray regime.

For purposes of the disclosed invention, the term "plasmonic" refers to an effect or condition that involves or is related to the collective oscillation of conduction-band electrons in a medium in response to an electromagnetic field.

For purposes of the disclosed invention, the term "semiconductor-laser interaction region" refers to the region where a driving laser field interacts with a semiconductor medium in order to generate high-order harmonics of the driving laser field from the medium.

For purposes of the disclosed invention, the term "movie" or "dynamic image" refers to the recordation of a series of images that have a temporal and/or spatial order and that, when played, capture a series of temporal and/or spatial events.

DESCRIPTION

As in stroboscopic photography, wherein the fastest motion that can be captured is defined by the camera shutter speed or the duration of the flash, accurate measurement of ultrafast phenomena are generally bound by the duration of the probe pulse. A laser pulse, for example, may be used as an optical probe for measurement of ultra-fast processes unraveling at molecular and atomic scales. The minimum achievable duration for an optical pulse is the time period of a single optical cycle. For standard lasers in infrared spectral ranges, this period corresponds to a few femtoseconds. A few femtoseconds is, therefore, the limit for the shortest pulse that can be generated with standard lasers. Breaching the attosecond atomic time scale barrier necessarily requires pushing the spectral region of operation from near-infrared (NIR) regime of standard lasers into the ultraviolet regime (VUV or XUV) and beyond.

Converting NIR photons (e.g. 1.6 eV) to much higher photon energies (e.g., 100 eV) requires a significant generation-energy boost. The necessary frequency up-conversion, required for generating ultraviolet range radiation from infrared range lasers, may occur when the optical response of a generating medium is driven into the non-linear regime. This may be accomplished, for example, through exposure to a very high intensity laser pulse. Any nonlinear system that is driven by an intense monochromatic field will respond at harmonic frequencies of the driving electromagnetic field. The harmonic response may stabilize over an extended range of harmonic-orders before it eventually drops off. Such a harmonic response profile, is characteristic of neutral atoms subjected to an intense electromagnetic field. When such an atomic medium is driven, for example, by an intense NIR laser pulse of central frequency $\omega_0$, it may exhibit a broadband emission profile consisting of several harmonics of the fundamental frequency $\omega_0$. The broadband emission profile may span a spectral range up to, for example, XUV and soft x-ray regime. This nonlinear strong-field optical process wherein a laser pulse of standard wavelength, such as infrared laser beam, is converted into coherent radiation in a much shorter wavelength regime, such as XUV or soft X-ray frequency regime, is known as high-order harmonic generation (HHG) process.

In the context of HHG, a laser pulse is considered strong when its electromagnetic field intensity approaches the characteristic atomic binding field strength, i.e., field strength or force experienced by electrons in the coulomb field of an atom in the generation medium. The strong electric field present at a laser focus will suppress the coulomb potential that holds the electron to the nucleus. The suppression of the coulomb potential facilitates a valence electron to tunnel through the potential barrier by a process known as strong field ionization. Following the ionization process the freed electron is accelerated in a trajectory away from its parent ion by the same electric field. When the oscillating electric field changes direction, during the negative half of the oscillation cycle, the electron trajectory is reversed. The electron is now accelerated back towards the parent ion by the electric field. On its way back the electron acquires a large amount of kinetic energy due to the strong acceleration imparted by the laser electric field. Upon re-collision and recombination with the parent ion the stored ionization energy and the kinetic energy of the electron, gained by its interaction with the laser field, is released as a radiation pulse. This radiation pulse will have a frequency related to the harmonics of the driving laser field. Since many electrons take part in this process, during each half-cycle of the laser field, there will be a broad distribution of possible trajectories and kinetic energies at recombination. This will correspond to multiple frequency components in the emission spectrum. The result is a broadband XUV emission with a typical spectrum of high-order harmonics. If the radiation is continuous and phase locked, the corresponding temporal profile will be that of an attosecond pulse whose duration decreases as the number of combined harmonics increases. The attosecond time-scale of the pulse emerges as a result of coherent superposition of harmonic orders of the fundamental frequency ($\omega_0$). Since this coherent process occurs at every half cycle of the periodic drive laser, the XUV emissions will be characterized by a series of attosecond-scale bursts separated in the time domain by half the laser period, i.e., $$\frac{1}{2}T.$$

The corresponding frequency domain representation is that of a harmonics frequency comb consisting of frequency peaks (harmonics) separated by twice the fundamental frequency, i.e., $2\omega_0$. The consecutive bursts correspond to respective electron-ion collisions emanating from opposite directions (due to being driven by opposite polarity half cycles of the oscillating laser field.) This results in the emission of spectral components with opposite phases (but the same amplitude due to the inversion-symmetric property of the generating medium.) The upshot is inherent destructive interference of the even-order harmonics (interchangeably referred to as even harmonics) and constructive interference of the odd-order harmonics (interchangeably referred to as odd harmonics.) Consequently, even-order harmonics are erased and only odd-order harmonics are observed in the standard HHG spectrum.

In principle a broad spectral width enables the formation of attosecond pulses. Following the identification of electron-ion re-collision as the primary interaction underlying HHG from atomic gas-based medium, experimental techniques have been developed to modulate the interaction to thereby tune and enhance the harmonic response of the atomic gas-based medium. These techniques are typically based on shaping the intensity profile of a driving field to thereby influence and modify the spectral characteristics (such as spectral phase) of the resulting high harmonic emissions (i.e., enhance the harmonic bandwidth generated through the laser-driven electron-ion re-collision process).

Disclosed embodiments of the present disclosure provide novel methods and systems for generation, processing and measurement of ultra-short probe signals as high-order harmonics in semiconductor material, thereby disclosing an operational platform and methodology for in-situ probing of internal electric fields in integrated solid-state electronics, photonics and optoelectronics systems and applications.

Electron-hole pair creation by high-order multiphoton transitions (often approximated as tunnelling), followed by the motion of the electrons and holes within and between their respective bands is the fundamental mechanism underlying strong-field light matter interactions and harmonic generation. In atoms, the motion of the electron can be characterized by two different dynamics. In one, known as intra-band transition, the newly freed electron undergoes oscillatory motion in the presence of the applied electric field. In the other, illustrated in FIG. 1, the freed electron undergoes a boomerang type trajectory that results in re-collision and recombination of the electron with its associated hole (parent ion) and emission of a high energy photon as a consequence of the process. Since both dynamics involve the formation of an oscillating dipole, they are both potential sources of harmonic radiation. In gaseous medium the former dominates low-order harmonics generation while the latter dominates high-order harmonics generation. In the case of high-order harmonic generation (HHG) in solids, contributions from both dynamics must be considered.

Intra-band transition in solids deviates from the free electron model in gases. Due to the interaction of the electron with the lattice, the electron motion does not follow the sinusoidal motion of the electric field. HHG model in solids must, therefore, include both mechanisms, namely the non-sinusoidal electron dynamics, and the electron-ion re-collision dynamics following a high-field ionization process. HHG processes in solid-state medium (such as, for example, a semiconductor substrate) may be used as a diagnostic tool for studying, for example, the ultrashort temporal and spatial dynamics and probing attosecond time-scale phenomena associated with solid-state electronics. In order to understand, control and ultimately exploit the potential of the HHG process as a solid-state based diagnostic tool, the primary physical mechanism for high-order harmonics generation in solids such as, for example, a semiconductor generation medium must be identified.

In accordance with one aspect of the disclosed invention a mid-infrared (MIR) laser pulse is used to study a response of a zinc oxide (ZnO) based semiconductor medium (semiconductor medium that comprises zinc oxide) to an incident high-intensity field. Short emission bursts corresponding to odd-ordered harmonics of the fundamental frequency of the MIR laser are recorded. This observation demonstrates successful generation of high-order harmonics from a semiconductor medium. Emissions corresponding to even-order harmonics of a driving field are observed when a driving field, introduced, for example, via a first input is perturbed with a weak secondary control field introduced, for example, via a second adjustable input. The secondary control filed may have a frequency equal to the second harmonic of the fundamental frequency (frequency of the driving field.) Further control over the high-order harmonic generation process is demonstrated by utilizing the adjustable input to variably delay the second-harmonic control field relative to the fundamental field. Modulation of the relative delay between second-harmonic control field and fundamental field results in modulation in the strength of the observed even harmonics emitted from the semiconductor medium. It is experimentally observed that the phase of the modulation as a function of harmonic order determines the spectral phase (emission time) of the emitted harmonic beam. This observation facilitates the characterization of physical mechanism underlying the HHG process in the semiconductor-based medium such as, for example, a semiconductor medium that comprises zinc oxide. Similar results, namely controlled generation of high harmonics and characterization of the underlying generation mechanism, are demonstrated for a silicon-based semiconductor medium, such as, for example, a semiconductor medium that comprises silicon. It should be noted that the second-harmonic control field may have an internal or an external source, i.e., it may be applied through one or more internal terminals fashioned on the surface or within the bulk of the semiconductor medium, or applied through one or more external terminals coupled to one or more external sources.

As stated earlier, strong-field assisted electron tunneling and the subsequent motion of the electron in the continuum, followed by a possible re-combination of the electron-hole pair is the fundamental mechanisms underlying HHG process. Due to its quantum nature, the interaction is governed by the phase of the released electron wave-packet. Therefore tracking the dynamics of the electron wave packet (from ionization to field-driven acceleration to radiative recombination with the parent ion) by way of treating HHG as a balanced electron interferometer, may help to elucidate the above-stated experimental observations.

Figure 1:
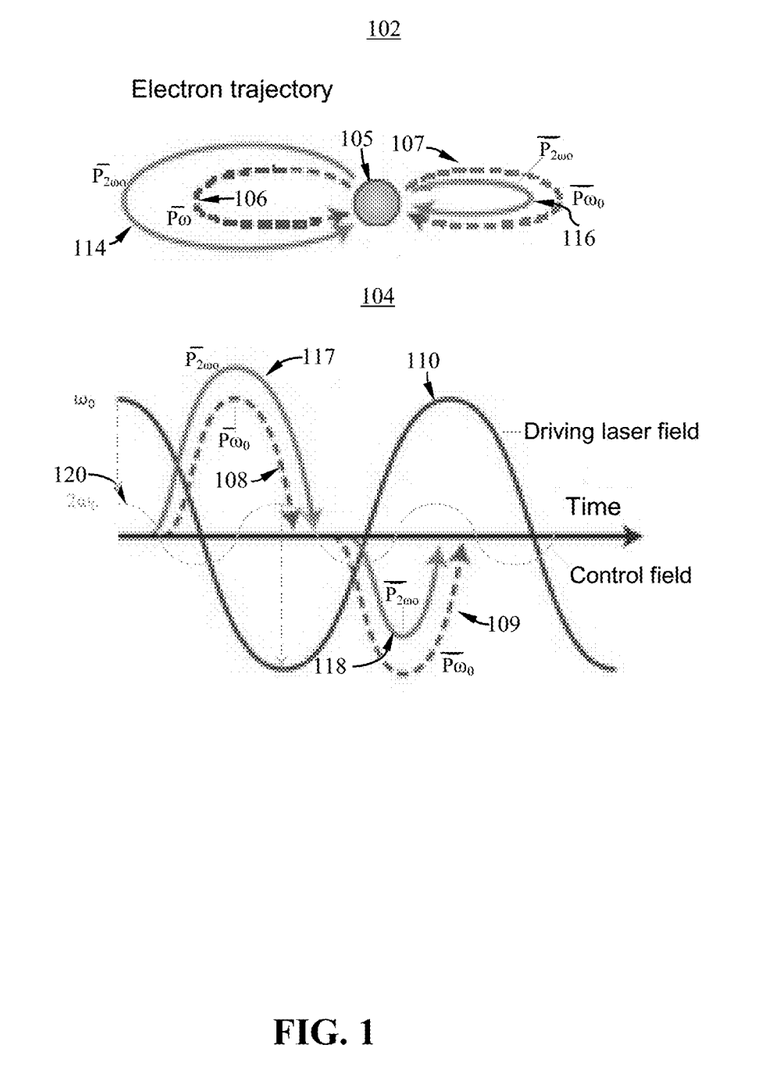
FIG. 1 is a pictorial representation of an electron's trajectories and field profiles for two successive half-cycles of a fundamental field in presence of a second-harmonic control field, according to one embodiment of the disclosed invention.

Initially, an intense laser field removes an electron from its host atom, splitting the wave function into a coherent superposition of a bound state and a free-electron wave packet. In the language of interferometry, ionization process acts as an effective beam splitter. Next, the free-electron wave packet moves in the oscillating laser field and returns to the parent atom during the negative half of the driving field oscillation cycle. This effectively corresponds to an adjustable delay line. Finally, during the re-collision, the two portions of the wave function overlap. The characteristics of the resulting interference (time-dependent dipole moment) are encoded in the output attosecond radiation pulse emitted from a generation medium. The amplitude, energy and phase of the re-collision electron are transferred to the emitted radiation pulse through the dipole moment (energy transition). The control of the spectral properties, temporal properties and spatial properties of the HHG process, and by extension those of the emitted harmonic beam, requires manipulating electron trajectories on attosecond time-scale. Trace diagrams 102 and 104 in FIG. 1, illustrate an electron's propagation paths (trajectories) 106 and 107 when a host atom 105 experiences a symmetric electric field, as illustrated by positive and negative half-cycles 108 and 109, respectively. Half-cycles 108 and 109 represent an electric field cycle experienced by a host atom 105 upon which a driving laser field 110 is incident. Hence forth, driving laser field 110 may be interchangeably referenced as fundamental field 110. As can be observed from trace diagram 102, electron propagation paths 106 and 107 are symmetric in response to the symmetric profile of half-cycles 108 and 109. As such the left and right arms of the interferometer are balanced.

Due to the non-linear nature of the strong-field light-matter interaction, small perturbations in the driving laser field 110 may result in large changes in harmonic behavior of a generating medium (of which host atom 105 is a part). Solid trace 114 and 116 illustrate the expected alterations in the propagation paths (trajectories) of an electron when an electric field experienced by host atom 105 is altered as illustrated by the asymmetric profile of positive and negative half-cycles 117 and 118, respectively. The alteration is due to the perturbation of driving laser field 110. The perturbation, in this case, is introduced in form of a weak secondary control field 120 with a frequency corresponding, for example, to the second harmonic of the fundamental frequency $\omega_0$ (frequency of the driving laser field 110). The secondary control field 120, henceforth referred to as second-harmonic control field, unbalances the interferometer by increasing or decreasing the electron propagation path (trajectory) by a small amount, thus adding or removing a small amount of phase to each arm of the interferometer. As a result, the phase accumulated by the propagating electron (propagation path 114) is enhanced in the half cycle 117 when the fundamental field 110 and the second-harmonic control field 120 are appropriately phased (similarly phased). Similarly, phase accumulated by the propagating electron (propagation path 116) is suppressed in the adjacent half cycle 118 when the fundamental field 110 and the second-harmonic control field 120 are oppositely phased. The shape of the electric field experienced by an atom (represented by trace 108, 118 and 117, 118) is variably modulated by changing the relative delay (relative phase) of the second-harmonic control field 120 with respect to the fundamental field 110. This alters the interference profile between the second-harmonic control field 120 and the fundamental field 110. The relative phase (relative delay) that maximizes the strength of the emitted harmonics carries information related to the phase of the interfering electron wave-packets.

Amplitude and spectral phase of the emitted harmonic radiation carries the complete information about the harmonic generation process. By tuning the temporal profile of driving laser field 110 to a known state, phase and amplitude distribution of the generated high-order harmonics, and by extension the time-domain characteristics of the isolated ultrashort radiation pulse, may be predicted.

When intense light irradiated a crystal that lacks inversion symmetry, the stimulated dipole is larger from one half of the driving laser than for the following half, resulting in the emission of radiation at the second harmonic frequency. This asymmetric motion can be mimicked in centro-symmetric crystals biased to a static electric field or a current. The process is interpreted in terms of a third-order perturbative expansion of the nonlinear polarization at the second harmonic frequency, whereby one zero-frequency photon ($E_{DC}$) adds to two photons of the fundamental laser frequency ($E_\omega$):

$$P_{2\omega} = \chi^{(3)} E_{DC} E_\omega^2 \qquad (1)$$

On the other hand, nonlinear optics in the non-perturbative regime are understood in terms of a different paradigm. In high-order harmonic generation the laser field ionizes electrons from their initially bound state, and accelerates them in a continuum of states on trajectories that lead to collisions of the electrons with their correlated holes. Upon collision, electrons and holes can recombine, thereby emitting high-harmonic photons. In accordance to one aspect of the disclosed invention the aforementioned paradigm is extended to electric-field induced generation of even high-order harmonics from Si and ZnO crystals.

Although it is widely accepted that electron-hole collisions dominate high-harmonic emission from gases, several emission mechanism may dominate emission from bulk solids. Therefore, in accordance to an embodiment of the disclosed invention, high-harmonic emission from Si is first characterized and to thereby demonstrate that it arises from colliding electron-hole pairs.

Figure 2:
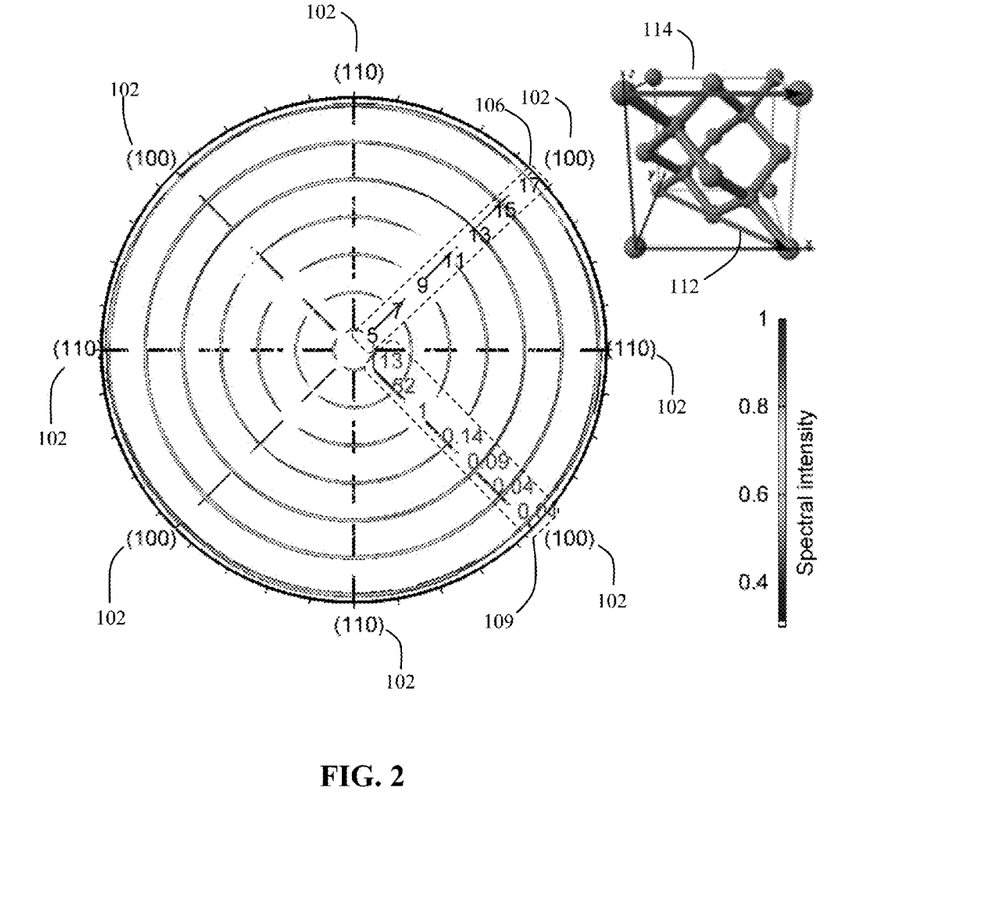
FIG. 2 illustrates the measured high harmonic spectra from Silicon extending from the $5^{th}$ to the $17^{th}$ order, according to one embodiment of the disclosed invention.

FIG. 2 illustrates the generated spectrum of high-harmonic photons of up to approximately 6 eV (corresponding to the $17^{th}$ order), which is the maximum energy detectable by the spectrometer, generated by focusing mid-infrared laser pulses with a center wavelength of around 3.5 μm at an intensity, in vacuum, of approximately 0.6 TW/cm$^2$ in a 500 nm Si single crystal on a sapphire substrate, in accordance to one embodiment. The measurements of high-harmonic spectrum FIG. 2 are illustrated as function of the crystallographic alignment 102 with respect to the linear laser polarization. The 4-fold rotational symmetry of the Si crystal is reflected in the symmetry of the emitted harmonics. The harmonic order 106 for the Silicon (Si) generated high-harmonics in FIG. 1 extend from the $5^{th}$ to the $17^{th}$ order, wherein each harmonic is separately normalized. The peak signal relative to the 9th order is denoted by 109 along the radial coordinate. Maximum Harmonic emission (where the harmonic emission is brightest) below the 13th order is achieved for laser polarization parallel to crystallographic alignment in the (110) direction, where the nonlinear current is accelerated along the projection of the Si—Si bonds on the plane normal to [001] (illustrate by arrow 112 in panel 114). The observed rotational dependence of high harmonics can only originate from the microscopic generation process because the linear optical properties of Si are isotropic.

Figure 3:
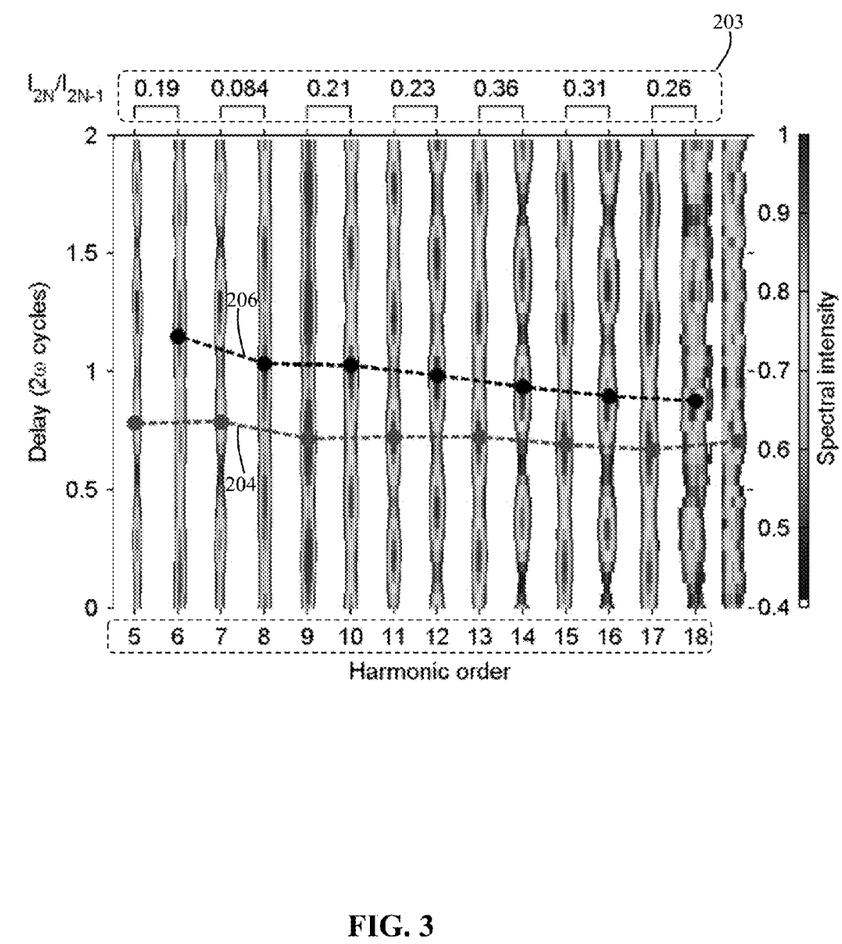
FIG. 3 is a graphic illustration showing the modulation phase that maximizes the intensity of a respective harmonic order, as a function of the harmonic order, according to one embodiment of the disclosed invention.

The mechanism responsible for high-harmonic emission is revealed by perturbing the generation process with a second harmonic field, thereby producing even harmonics. This effect is illustrated in the measurement results of FIG. 3. Referencing FIG. 3 measurement results, both driver field (i.e., the field associated with the driver laser) and its second harmonics are linearly polarized along the crystallographic alignment in the (110) direction. The relative intensity of even and odd harmonics is shown by 203. The signal in each order is separately normalized. Additionally trace 204 represents the phase of the oscillation for the odd harmonics, while trace 206 represents the phase of the oscillation for the even harmonics. As shown in FIG. 3, the harmonic intensity modulates as the second harmonic is delayed relative to the fundamental. It is also noted, by examining trace 206, that the optimum phase that maximizes the intensity of the even harmonics is markedly different between orders, while the phase of the oscillation for the odd harmonics (trace 204) does not change with harmonic order. Therefore, as demonstrated for ZnO, the variation of the optimum phase with harmonic order identifies an emission mechanism whereby the laser field excites an electron-hole pair near the minimum direct band gap (at around 3.4 eV in Si) and accelerates the two particles on a path that collides one with the other sometime later in the laser cycle. Upon collision, the electron can recombine with the hole, thereby emitting a high harmonic photon with energy equal to the crystal momentum of the pair at the time of collision.

In a recollision model of high-order harmonic generation, the phase cumulated by the electron-hole pair in the presence of a perturbing field $E_2$ is:

$$\Phi=\Phi_0+\int_{t'}^{t}\Delta v[k+A(t)-A(t'')][A_2(t)-A_2(t)]dt''=\Phi_0+\sigma \quad (2)$$

Where $\Phi_0$ is the high-harmonic dipole phase accumulated in the driving field only, $\Delta v(k)=v_c(k)-v_v(k)$ is the difference in the conduction and valence band velocities (where $v=\nabla\epsilon(k)$, $\epsilon(k)$ is the band energy), k is the crystal momentum, A(t) is the vector potential of the driving laser field, and $A_2$ (t) is the vector potential of the perturbing field. The integral runs between the time of creation of the electron-hole pair by strong-field excitation (t') and the time of recombination (t). In the case of a static perturbing field, $A_2=-E_{DC}t$, so that:

$$\sigma=E_{DC}\int_{t'}^{t}\Delta v[k+A(t)-A(t')](t-t)dt \quad (3)$$

The intensity of the even harmonics[24] is proportional to $|\sigma|^2 \sim E^2_{DC}$.

A second harmonic intensity of $9\times10^{-4}$ of the driver is sufficient to imprint a clear signature of even order harmonics on the high harmonic spectrum. This intensity may corresponds to a field strength of approximately 30 V/μm, in accordance to one disclosed embodiment. Static fields of comparable strength are present in conventional semiconductor circuits. This observation leads to one embodiment of the disclosed invention which discloses a system and method for high resolution dynamic imaging of the internal electric fields in operating semiconductor devices and integrated circuits.

Semiconductor circuits are grown on semiconductor materials. High harmonics or high-order harmonics may be generated and measured in these materials, as described above. Additionally, high harmonics or high-order harmonics may be used to spatially image the circuit. For example, when the circuit is off, the measured pattern reflects the shape and location of the semiconductor devices in the circuit. The circuit geometry can be reconstructed from the pattern by employing available algorithms. When the circuit is on, the electric fields modifies the pattern. Subsequently comparison of this pattern to the "off pattern" allows the algorithm to reconstruct the distribution and magnitude of the electric fields in the circuit. The spatial resolution of the method is limited by the wavelength of the harmonics, approximately 100 nm. Those skilled in the art will realize that imaging can be made active as follows: The harmonic generation process (which is much faster than any electrical switching speed) can be delayed frame by frame to make a movie or dynamic image of the field as a function of time. Hence, this method allows the direct 2D imaging of the instantaneous magnitude and temporal/spatial propagation profile of electric fields in an active circuit, resulting in the ability to construct a high resolution dynamic profile of the internal electric fields associated with the operation of semiconductor devices. Presently, there are no methods that can measure the chip internal fields. It is potentially relevant for gaining greater insight into operation of integrated circuits and for developing more precise electronic simulation tools and models. Additionally, direct observation of charge transfer and electronic dynamics in photovoltaic cells and transistors through monolithic integration of attosecond spectroscope in semiconductor substrate can facilitate development of new photovoltaic cells that are more efficient, and transistors that switch faster.

Figure 4:
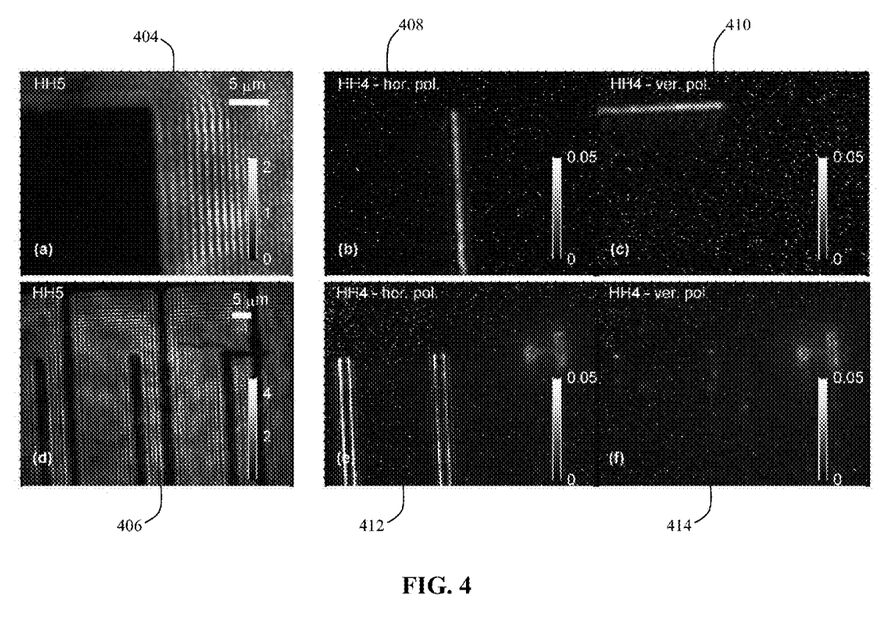
FIG. 4 illustrates images of the $4^{th}$ and the $5^{th}$ harmonics for a single electrode and interdigitated electrode integrated in a silicon film, according to one embodiment of the disclosed invention.

Empirical measurements illustrated in FIG. 4 further illustrate the described concept. By applying a weak pulsed static field to Au electrodes deposited on Si (see Example 1 for details about the fabrication), perturbations are imposed on the electron-hole trajectories and even harmonic emission up to the 8th order (at a wavelength of 250 nm) are recorded. While odd harmonics (404 and 406 show images of the 5th order) return structural information in the emission region—the Au electrodes mask the Si film and block harmonic emission, even harmonics (408, 410, 412 and 414 show images of the 4th order) return the distribution of the static electric field around the electrodes. The static field only efficiently perturbs the trajectories when it is polarized parallel to the infrared driver field (the electric field of the driver laser.) As a result, rotating the polarization of the driver field from horizontal (408, 412) to vertical (410, 414) reveals the quadrature components of the field from which its vector can be obtained. As expected for prototypical device, the static field is polarized perpendicular to the electrode.

Figure 5:
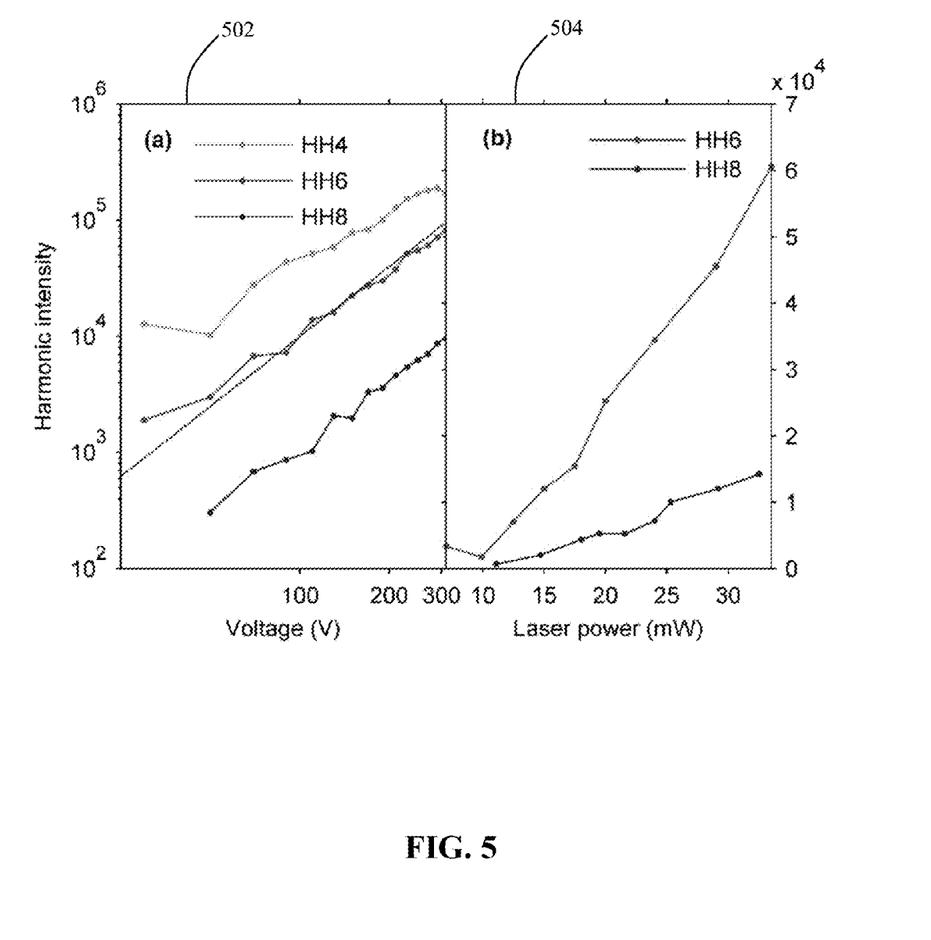
FIG. 5 illustrates harmonic intensity as a function of applied voltage and laser intensity for even harmonic orders, according to one embodiment of the disclosed invention.

The measured harmonic intensity as a function applied voltage and laser power for the prototypical device of FIG. 4 is illustrated, respectively, in trace diagram 504 and 506 of FIG. 5. As may be observed in trace diagram 504, all even harmonics scale quadraticaly with the applied voltage in agreement with the recollision model. The even harmonic signal increases quadratically with the voltage, as illustrated by graph 502 of FIG. 5, which is consistent with both the perturbative (Eq. 1) and nonperturbative model (see Examples) However, despite the high-order of the harmonics, the even harmonic intensity increases linearly with the driving laser intensity, as illustrated in graph 504 of FIG. 5, thus confirming their non-perturbative nature.

Dynamical imaging of the electric fields may be obtained by delaying a pulsed static signal with respect to the laser pulse. The static field is delayed in steps of 4 ns with respect to the laser pulse. The degree of fidelity of the high-harmonic measurement can be appreciated in graph 601 of FIG. 6 that shows the spectrally integrated signal from the $6^{th}$ harmonic 602 as a function of delay with respect to the applied electrical pulse 604. Sampling of time-dependent field is accomplished as the electric field 604 is sensed during the short lifetime of the electron-hole pair, which is of sub-laser cycle duration. Hence, the method has potential to sense electric fields from DC to PHz frequencies.

Figure 6:
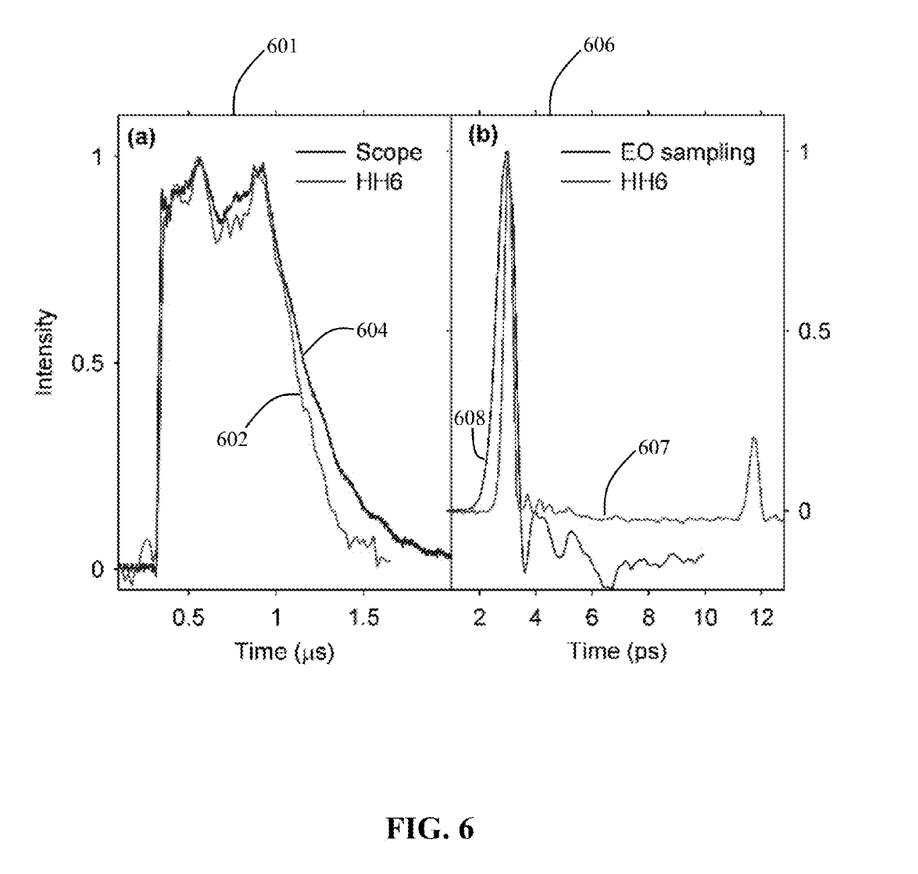
FIG. 6 illustrates sampling of a pulsed static electric field and a half-cycle THz pulse using a $6^{th}$ order harmonic wave, according to one embodiment of the disclosed invention.

It is observed from graph 601 that the square root of the harmonic signal follows the electric field. This effect was also observed in graph 502 of FIG. 5 wherein the harmonic signal was demonstrated to scale quadratically with the applied perturbing field strength.

The potential of the aforementioned method to sense electric fields from DC to PHz frequencies is further demonstrate in graph 606 by recording the $6^{th}$ harmonic (red line) as generated by the overlap between a THz pulse and an infrared driver of high-harmonics from a ZnO crystal (see Examples) as illustrated. The measured results in 606 include a trace 607 which represent the $6^{th}$ harmonic sampling of a half-cycle THz pulse and trace 608 representing the half-cycle THz pulse as measured (sampled) with electro-optic sampling in a 2 mm thick ZnTe crystal with 800 nm pulses acting as temporal gate. The peak THz pulse is estimated at 27 kV/cm with electro-optic sampling. The pulse at approximately 12 ps in 606 is consistent with a THz pulse that performs a round-trip in the sapphire substrate, after being reflected form the output and entrance surfaces.

Using the high-harmonics provides a convenient advantage over other methods, such as electro-optic sampling, because it does not need to satisfy phase matching in an electro-optic crystal. In fact, the THz field measured with a 2 mm thick ZnTe electro-optic crystal 608—a crystal thickness that purposely narrows the detectable bandwidth—is longer than that retrieved by the $6^{th}$ harmonic. By combining high-harmonic THz sampling with biased electrodes it will be possible to interfere even harmonics from the THz pulse with those generated by the static field, thereby enabling coherent detection of the former. Given the strength of the applied bias voltage, the peak field strength can also be directly evaluated (as opposed to indirect estimates based on independent measurements of focus size and pulse duration).

EXAMPLES

Example 1

Experimental Setup

A disclosed embodiment provides an experimental set up for generating results illustrated in FIG. 2, for example, a MIR linearly polarized laser pulses of approximately 100 fs duration with a central wavelength of around 3.5 μm (0.35 eV photon energy) in an approximately 500 nm thick Si single crystal, at a vacuum intensity of approximately 0.6 TW/cm². In accordance to one embodiment, The film is epitaxially grown on a 500 μm thick R-plane Sapphire substrate. The beam is incident on the silicon side. The (100) orientation of the Si lattice is parallel to the projection of the c-axis of Sapphire on the surface. Measurement of the birefringence of the substrate determines the orientation of this projection with respect to the laser polarization, which ultimately determines the orientation of the Si lattice with respect to the latter. The surface normal is aligned to the (001) direction, and is parallel to the laser k-vector.

Another disclosed embodiment provides an experimental set up for generating results summarized in FIG. 3, for example, laser pulses of about 55 fs duration with a central wavelength of approximately 3.7 μm (0.33 eV photon energy) are focused in a 40 nm Si single crystal at an intensity of approximately 0.6 TW/cm². The film is plasma etched from its initial thickness of 500 nm. In this experiment, the beam is incident on the Sapphire side, but to avoid birefringence the polarization is set parallel to the (110) direction. The electrodes are fabricated on the Si layer by, for example, a standard lift-off process: a 1.5 μm thick photoresist is spun and baked onto the sample, exposed on an EVG-620 mask aligner under vacuum contact mode and developed into a TMAH based solution. A 50 nm thick Au layer (with a 5 nm thick Cr adhesion layer) is then deposited on the patterned photoresist using e-beam evaporation and the sample is soaked into a solvent for few hours to complete the interdigitated electrodes fabrication.

Yet another disclosed embodiment provides an experimental set up for generating even harmonics of a 2.1 μm femtosecond source with a synchronized THz pulse (center frequency approximately 0.5 THz). The THz pulse is generated by electro-optic switching in a ZnSe substrate covered with an interdigitated structure of Au electrodes. The electrodes are biased to a nanosecond pulsed of approximately 1 kV power supply, synchronized with femtosecond 400 nm pulses that illuminate the ZnSe substrate. The 400 nm pulses are obtained by frequency doubling 800 nm pulses from a regenerative Ti:Sapphire amplifier. Residual visible and infrared light is blocked by a plastic sheet. The THz pulses are tightly focused on a 500 nm ZnO film (grown over a 500 μm thick sapphire substrate, c-axis cut), where high harmonics are generated by 2.1 μm pulses overlapped in space and time with the THz pulse. The THz pulse generates even harmonics up to the $8^{th}$ order (the highest order the spectrometer can detect). Harmonics are detected with, for example, an OceanOptics USB2000+ spectrometer up to a wavelength of approximately 200 nm.

Many functional materials, such as Si-based heterojunctions in traditional semiconductor chips and modern 2D materials heterostructures, rely on the electric field that builds up at the interface between the material's dissimilar constituents. Together with the structure of the junction, the spatial distribution and the dynamics of these electric fields determine the function of the material. Although much effort has been devoted to imaging the structure, the potential for imaging the fields remains largely untapped. Perturbative optical nonlinearities provide ways to measure electric fields in materials, but the low order of the nonlinearity limits the spatial and temporal resolutions. According to disclosed embodiments, nonlinear electric-field effects are extended to the non-perturbative regime by dynamically imaging even-order high-harmonics of infrared femtosecond laser pulses. The even harmonics are generated from Si and ZnO crystals when static or THz fields are present in the interaction region. The demonstrated applicability to Si promises high resolution movies or dynamic images of operating electronic circuits and memories, as well as of Si-photonic devices. For THz detection, the method overcomes issues of phase-matching in electro-optic crystals.

Thus, disclosed embodiments of the invention demonstrate that collision-based high-harmonics from semiconductor or dielectric material/medium such a ZnO and Si—the most technologically relevant material—are exquisite quantum sensors of electric fields that permeate the materials. Dynamical imaging of the even harmonics allows to record movies or dynamic images of electric fields in operating semiconducting devices with high temporal and spatial resolutions, and sensitivity as high as few Wm. Given the short wavelength of the harmonics recorded in accordance to embodiment of the disclosed invention, it will be possible to achieve spatial resolution at least as high as approximately 100 nm. Even higher resolution can potentially be achieved by overcoming laser-induced damage to generate higher photon energies, for example by using shorter pulses. Such high temporal and spatial resolutions and high sensitivity cannot be achieved simultaneously by perturbative electric-field induced second harmonic generation. Finally, the existence of real-space trajectories brings a time-space perspective to imaging of electric fields which is absent in perturbative nonlinear optics. In addition, the invention allows for examination of the whole surface at one time with high spatial field and time resolution, i.e., no need for a set of discrete point samples. This eliminates the both the time delay and complicated mechanisms associated with positioning a device for smaller point resolution solutions.

Embodiments of the disclosed invention extend nonlinear electric-field effects to the non-perturbative regime by dynamically imaging even-order high-harmonics of high intensity driving laser field, such as, for example, infrared femtosecond laser pulses. The even harmonics are generated from semiconductor material, such as silicon and zinc oxide crystals, when static or terahertz (THz) fields are present in the interaction region of the high intensity laser field and the semiconductor material. The demonstrated applicability to silicon enables high resolution movies or dynamic images of operating electronic circuits and memories, as well as of Si-photonic devices. For THz detection, the embodiments overcomes issues of phase-matching in electro-optic crystals.

Embodiments of the disclosed invention describe practical implementation of the technique to operating semiconductor chips and superconducting circuits in quantum information devices. The disclosed method provides sensitive and non-invasive probing of these devices to reverse-engineer their function or to access information stored within. A number of other applications seem feasible too. Electric fields are associated with some lattice vibrations, such as propagating surface acoustic waves on ferroelectric materials. These waves are used, for example, to control information processing between quantum bits (qubits) embedded in the material. Imaging the acoustic wave may prove useful to improve the design of these devices. The method may also prove useful to develop better nonlinear light-matter interactions in nanoscale semiconducting cavities. Here, the position of quantum dots relative to the field maxima of the standing-wave in the cavity greatly affects the light-dot interaction. The position of the field crests and the effect of the dot on the field can potentially be imaged with the high harmonics.

REFERENCES

The following references describe technology that may be utilized with the disclosed invention and contents and disclosure of the following references are incorporated herein by reference:
1. Ashcroft, Neil W., and N. David Mermin. "Solid state physics." (1976), ch. 29.
2. Raja, Archana, et al. "Coulomb engineering of the bandgap in 2D semiconductors." arXiv preprint arXiv: 1702.01204 (2017).
3. Holler, Mirko, et al. "High-resolution non-destructive three-dimensional imaging of integrated circuits." Nature 543.7645 (2017): 402-406.
4. Dierolf, M. et al. Ptychographic X-ray computed tomography at the nanoscale. Nature 467, 436-439 (2010)
5. Gignac, L. M., Beslin, C., Gonsalves, J., Stellari, F. & Lin, C. C. High energy BSE/SE/STEM imaging of 8 um thick semiconductor interconnects. Microsc. Microanal. 20, 8-9 (2014)
6. Tetienne, Jean-Philippe, et al. "Quantum imaging of current flow in graphene." Science Advances 3.4 (2017): e1602429.
7. Timurdogan, E., et al. "Electric field-induced second-order nonlinear optical effects in silicon waveguides." Nature Photonics 11.3 (2017): 200-206.
8. Sun, Chi-Kuang, et al. "Scanning second-harmonic/third-harmonic generation microscopy of gallium nitride." Applied Physics Letters 77.15 (2000): 2331-2333.
9. Terhune, R. W., P. D. Maker, and C. M. Savage. "Optical harmonic generation in calcite." Physical Review Letters 8.10 (1962): 404.
10. Piggott, Alexander Y., et al. "Inverse design and demonstration of a compact and broadband on-chip wavelength demultiplexer." Nature Photonics 9.6 (2015): 374-377.
11. Englund, Dirk, et al. "Controlling cavity reflectivity with a single quantum dot." Nature 450.7171 (2007): 857-861.
12. Dexheimer, Susan L., ed. Terahertz spectroscopy: principles and applications. CRC press, 2007, chapter 2, pages 48-49.
13. Boyd, Robert W. "Nonlinear optics." Handbook of Laser Technology and Applications (Three-Volume Set). Taylor & Francis, 2003. 161-183.
14. Ruzicka, Brian A., et al. "Second-harmonic generation induced by electric currents in GaAs." Physical review letters 108.7 (2012): 077403.
15. Bloembergen, Nicolaas, and P. S. Pershan. "Light waves at the boundary of nonlinear media." Physical Review 128.2 (1962): 606.
16. Corkum, Paul B. "Plasma perspective on strong field multiphoton ionization." Physical Review Letters 71.13 (1993): 1994.
17. Ferray, M., et al. "Multiple-harmonic conversion of 1064 nm radiation in rare gases." Journal of Physics B: Atomic, Molecular and Optical Physics 21.3 (1988): L31.
18. Corkum, P. áB, and Ferenc Krausz. "Attosecond science." Nature Physics 3.6 (2007): 381-387.
19. Vampa, G., et al. "Linking high harmonics from gases and solids." Nature 522.7557 (2015): 462-464.
20. Ghimire, Shambhu, et al. "Observation of high-order harmonic generation in a bulk crystal." Nature physics 7.2 (2011): 138-141.
21. Luu, Tran Trung, et al. "Extreme ultraviolet high-harmonic spectroscopy of solids." Nature 521.7553 (2015): 498-502.
22. Schubert, Olaf, et al. "Sub-cycle control of terahertz high-harmonic generation by dynamical Bloch oscillations." Nature Photonics 8.2 (2014): 119-123.
23. Vampa, G., et al. "Theoretical analysis of high-harmonic generation in solids." Physical review letters (2014): 073901.
24. Dudovich, N., et al. "Measuring and controlling the birth of attosecond XUV pulses." Nature physics 2.11 (2006): 781-786.

25. Lopez-Martens, Rodrigo, et al. "Amplitude and phase control of attosecond light pulses." *Physical Review Letters* 94.3 (2005): 033001.
26. Kim, Kyung Taec, et al. "Petahertz optical oscilloscope." *Nature Photonics* 7.12 (2013): 958-962.
27. Chiorescu, I., et al. "Coherent quantum dynamics of a superconducting flux qubit." *Science* 299.5614 (2003): 1869-1871.
28. McNeil, R. P. G., et al. "On-demand single-electron transfer between distant quantum dots." *Nature* 477.7365 (2011): 439-442.
29. Chang, Chuan C. "Silicon-on-sapphire epitaxy by vacuum sublimation: Leed-auger studies and electronic properties of the films." *Journal of Vacuum Science and Technology* 8.3 (1971): 500-511.3).

All documents, patents, journal articles and other materials cited in the present application are incorporated herein by reference.

Having described the various embodiments of the disclosed invention in detail, it will be apparent that modifications and variations are possible without departing from the scope of the invention defined in the appended claims. Accordingly, it is intended that the disclosed invention not be limited to the described embodiments, but that it has the full scope defined by the language of the following claims, and equivalents thereof. It is understood that other embodiments may be utilized and structural changes may be made without departing from the scope of the invention. Furthermore, it should be appreciated that all examples in the present disclosure, while illustrating many embodiments of the invention, are provided as non-limiting examples and are, therefore, not to be taken as limiting the various aspects so illustrated.

What is claimed:

1. A method comprising:
   generating one or more high-order harmonics in a semiconductor or dielectric medium;
   utilizing the one or more high-order harmonics generated within the semiconductor or dielectric medium to thereby facilitate an interaction of one or more high-order harmonics with one or more internal electric fields of the one or more semiconductor devices;
   measuring the one or more high-order harmonics to construct a high resolution dynamic profile of the one or more internal electric fields; and
   delaying generating the one or more high-order harmonics frame by frame, to thereby generate a high-resolution dynamic images of the one or more internal electric fields as a function of time.

2. The method of claim 1, wherein the one or more high-order harmonics are generated by exposing the semiconductor or dielectric medium to a high intensity laser field.

3. The method of claim 1, wherein the high resolution dynamic profile of the one or more internal electric fields is constructed by measuring one or more even-order harmonics of the one or more high-order harmonics.

4. The method of claim 1, wherein the one or more internal electric fields range from DC to PHz frequencies.

5. A method comprising:
   generating one or more high-order harmonics in a semiconductor or dielectric medium;
   utilizing the one or more high-order harmonics generated within the semiconductor or dielectric medium to thereby facilitate an interaction of one or more high-order harmonics with one or more internal electric fields of the one or more semiconductor devices; and
   measuring the one or more high-order harmonics to construct a high resolution dynamic profile of the one or more internal electric fields,
   wherein the one or more high-order harmonics are generated by exposing the semiconductor or dielectric medium to a high intensity laser field,
   wherein the high intensity laser field is polarized parallel to the one or more internal electric fields of the one or more semiconductor devices.

6. The method of claim 5, wherein the semiconductor or dielectric medium comprises silicon.

7. The method of claim 5, wherein the semiconductor or dielectric medium comprises zinc oxide.

8. The method of claim 5, wherein the high resolution dynamic profile of the one or more internal electric fields is measured by delaying a pulsed static signal with respect to the high intensity laser field.

9. A method comprising:
   generating one or more high-order harmonics in a semiconductor or dielectric medium;
   utilizing the one or more high-order harmonics generated within the semiconductor or dielectric medium to thereby facilitate an interaction of one or more high-order harmonics with one or more internal electric fields of the one or more semiconductor devices; and
   measuring the one or more high-order harmonics to construct a high resolution dynamic profile of the one or more internal electric fields,
   wherein the one or more high-order harmonics are generated by exposing the semiconductor or dielectric medium to a high intensity laser field,
   wherein the high intensity laser field is delivered by one or more mid-infrared laser pulses.

10. A method comprising:
    generating one or more high-order harmonics in a semiconductor or dielectric medium;
    utilizing the one or more high-order harmonics generated within the semiconductor or dielectric medium to thereby facilitate an interaction of one or more high-order harmonics with one or more internal electric fields of the one or more semiconductor devices; and
    measuring the one or more high-order harmonics to construct a high resolution dynamic profile of the one or more internal electric fields,
    wherein the one or more high-order harmonics are generated by exposing the semiconductor or dielectric medium to a high intensity laser field,
    wherein generating the one or more high-order harmonics is based on an electron-ion re-collision process in the semiconductor or dielectric medium induced by the high intensity laser field.

11. The method of claim 10, wherein a sampling of the one or more internal electric fields occurs during a period of the electron-ion re-collision process.

12. The method of claim 11, wherein the period of the electron-ion re-collision process corresponds to a sub-cycle of the high intensity laser field.

13. An apparatus comprising:
    a semiconductor substrate, wherein the semiconductor substrate comprises:
    a semiconductor-laser interaction region;
    a first input configured to focus a driving laser field onto the semiconductor-laser interaction region to thereby generate one or more high-order harmonics in the semiconductor-laser interaction region;

a second input configured to control the one or more high-order harmonics generated within the semiconductor substrate,
  wherein the one or more high-order harmonics interact with one or more internal electric fields in the semiconductor substrate; and
an output for outputting the one or more high-order harmonics,
  wherein the driving laser field comprises a mid-infrared laser pulse.

14. The apparatus of claim 13, wherein the one or more internal electric fields in the semiconductor substrate are generated by one or more semiconductor devices on or within the semiconductor substrate.

15. The apparatus of claim 14, wherein the second input controls the generation of the one or more high-order harmonics by the one or more semiconductor devices on or within the semiconductor substrate.

16. The apparatus of claim 13, wherein the semiconductor substrate comprises silicon.

17. The apparatus of claim 13, wherein the semiconductor substrate comprises zinc oxide.

18. The apparatus of claim 13, wherein the one or more internal electric fields range from DC to PHz frequencies.

19. An apparatus comprising:
a semiconductor substrate, wherein the semiconductor substrate comprises:
a semiconductor-optical interaction region;
a first input configured to focus an optical stimulation onto the semiconductor-optical interaction region to thereby generate one or more high-order harmonics in the semiconductor-optical interaction region;
a second input configured to control the one or more high-order harmonics generated within the semiconductor substrate, wherein the one or more high-order harmonics interact with one or more internal electric fields in the semiconductor substrate;
an output for outputting the one or more high-order harmonics;
a measuring device in communication with the output, the measuring device for measuring the one or more high-order harmonics to construct a high resolution dynamic profile of the one or more internal electric fields; and
a delaying device for delaying generation the one or more high-order harmonics frame by frame, to thereby generate a high-resolution dynamic images of the one or more internal electric fields as a function of time.

* * * * *